(12) United States Patent
Ahmad

(10) Patent No.: US 7,265,601 B2
(45) Date of Patent: Sep. 4, 2007

(54) ADAPTIVE GATE DRIVE VOLTAGE CIRCUIT

(75) Inventor: Faisal Ahmad, El Segundo, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 11/207,507

(22) Filed: Aug. 19, 2005

(65) Prior Publication Data
US 2006/0038547 A1 Feb. 23, 2006

Related U.S. Application Data

(60) Provisional application No. 60/603,814, filed on Aug. 23, 2004.

(51) Int. Cl.
*H03K 17/693* (2006.01)
(52) U.S. Cl. .................. 327/403; 327/389; 323/313
(58) Field of Classification Search ........ 323/282–290, 323/222, 224, 265, 271–274, 268; 363/17, 363/19, 75, 78, 84, 98; 327/366, 110, 380, 327/389, 540–541, 381, 391, 403, 170, 543
See application file for complete search history.

(56) References Cited

U.S. PATENT DOCUMENTS

| | | | | |
|---|---|---|---|---|
| 5,408,150 A | * | 4/1995 | Wilcox | 327/108 |
| 5,731,731 A | * | 3/1998 | Wilcox et al. | 327/403 |
| 6,157,182 A | * | 12/2000 | Tanaka et al. | 323/284 |
| 6,229,289 B1 | * | 5/2001 | Piovaccari et al. | 323/268 |

* cited by examiner

*Primary Examiner*—Rajnikant B. Patel
(74) *Attorney, Agent, or Firm*—Ostrolenk, Faber, Gerb & Soffen, LLP

(57) ABSTRACT

A circuit and method for reducing losses in a DC/DC converter by optimizing gate drive voltage. The circuit and method detect a change in the output load, or more specifically the output current, and adjust the gate voltage accordingly; in other words, providing adaptive gate drive voltage. In response to a reduction of output current, the invention reduces the gate voltage so as to reduce both conduction and switching losses in the semiconductor switching devices in the output stage.

21 Claims, 4 Drawing Sheets

ADAPTIVE GATE DRIVE VOLTAGE CIRCUIT

CROSS REFERENCE TO RELATED APPLICATION

The present application is based upon and claims priority of U.S. Provisional Application Ser. No. 60/603,814 filed Aug. 23, 2004, incorporated by reference in its entirety.

BACKGROUND OF THE INVENTION

1. Field of the Invention

The present invention relates to a DC/DC converter, and more particularly to a DC/DC converter including a circuit for driving the gates in the output stage adaptively as a function of output current.

2. Related Art

DC/DC converter designs today are supporting very high output currents of greater than 100 A. A key challenge at this power level is to reduce power loss to keep system efficiency as high as possible, given other system constraints such as board area, cost, etc. One technique that has been used to improve efficiency in these systems is to adjust the gate drive voltage to minimize the combination of switching loss and conduction loss in the converter.

A known DC/DC power output stage is shown schematically in FIG. 1. As seen, the output stage comprises a pair of power MOSFETs designated CTRL FET and SYNC FET connected in a totem-pole configuration with the source of CTRL FET and the drain of SYNC FET connected together at a node "A". The drain of CTRL FET is connected to a high voltage supply and the source of SYNC FET is grounded. The CTRL FET is driven with a voltage $V_{GATE}$ and a current $I_{GATE}$ and supplies an output current $I_{OUT}$ at a voltage $V_{OUT}$. Filter elements $L_{OUT}$ and $C_{OUT}$ are also shown.

In this circuit, the switching loss, the gate drive loss, and the conduction loss in CTRL FET are given by the following expressions:

$$\text{Switching loss} = V_{GATE} \cdot I_{OUT} \cdot F_{SWX} \cdot \frac{Q_{GS} + Q_{GD}}{I_{GATE}} \quad (1)$$

$$\text{Gate drive loss} = V_{GATE} \cdot Qg \cdot F_{SWX} \quad (2)$$

$$\text{Conduction loss} = I_{OUT}^2 \cdot R_{DSON} \quad (3)$$

wherein:

$F_{SWX}$=switching frequency,
$Qg$=total charge,
$Q_{GS}$=gate-source charge,
$Q_{GD}$=gate-drain charge, and
$R_{DSON}$ is a function of $V_{GATE}$.

Conduction losses can be reduced by increasing the gate drive voltage, albeit with diminishing returns.

FIG. 2 is a graph showing total power loss vs. gate drive voltage at 120 A load in a typical converter. As seen, the converter has an optimal gate drive voltage for this current level, where the total power loss reaches a minimum.

However, this known technique of tuning the gate drive voltage to minimize power loss only works well at one load current and is typically set at the maximum output load. In applications where the load current can drop to a very low percentage of full load current, the conduction power loss also decreases rapidly, but the switching power loss still burdens the converter, effectively reducing the overall system efficiency in this lighter load condition. Effectively, the optimal gate drive voltage level which minimizes power loss has changed due to the decreased load current.

SUMMARY OF THE INVENTION

The present invention provides a practical circuit and method that make it possible to reduce losses by optimizing gate drive voltage.

More specifically, the circuit and method detect a change in the output load, or more specifically the output current, and adjusts the gate voltage accordingly; in other words, providing adaptive gate drive voltage. In response to a reduction of output current, the invention reduces the gate voltage so as to reduce gate drive, conduction and switching losses in the semiconductor switching devices in the output stage.

The circuitry can be added to a standard DC/DC converter system, for example, to adaptively adjust gate drive voltage. The conventional circuitry includes a PWM control IC, gate drivers, power MOSFETs, and an output filter. The invention, in addition, senses output current information and uses that information to adjust the gate drive voltage.

The invention thereby provides several advantages. For example, efficiency is improved at light loads while maintaining switching frequency, preventing unwanted noise due to hysteretic mode behavior. Also, an optimized gate drive voltage can be automatically generated for all output current conditions, effectively reducing power loss.

Other features and advantages of the present invention will become apparent from the following description of embodiments of invention which refers to the accompanying drawings.

DETAILED DESCRIPTION OF EMBODIMENTS OF THE INVENTION

Figure 1:
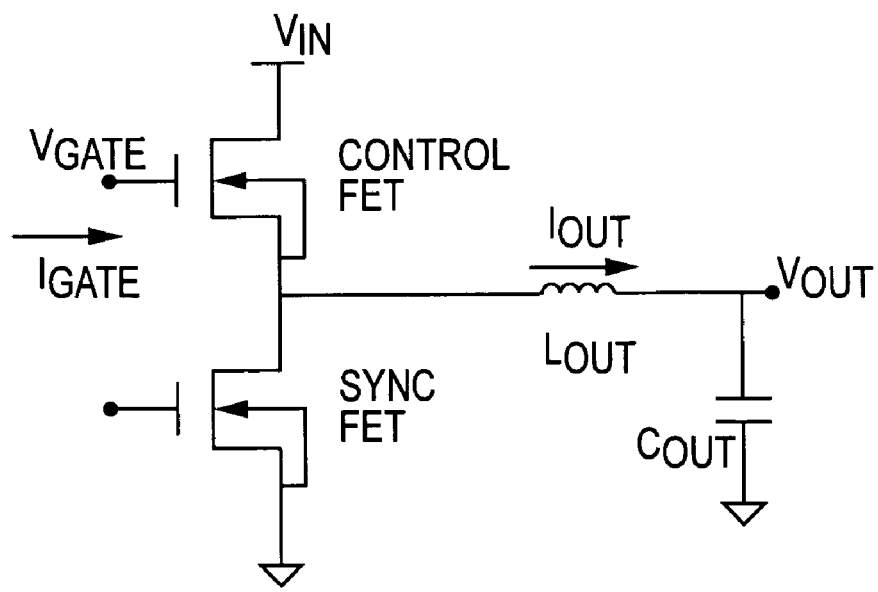
FIG. 1 is a schematic diagram of a conventional DC/DC converter output stage.
Figure 2:
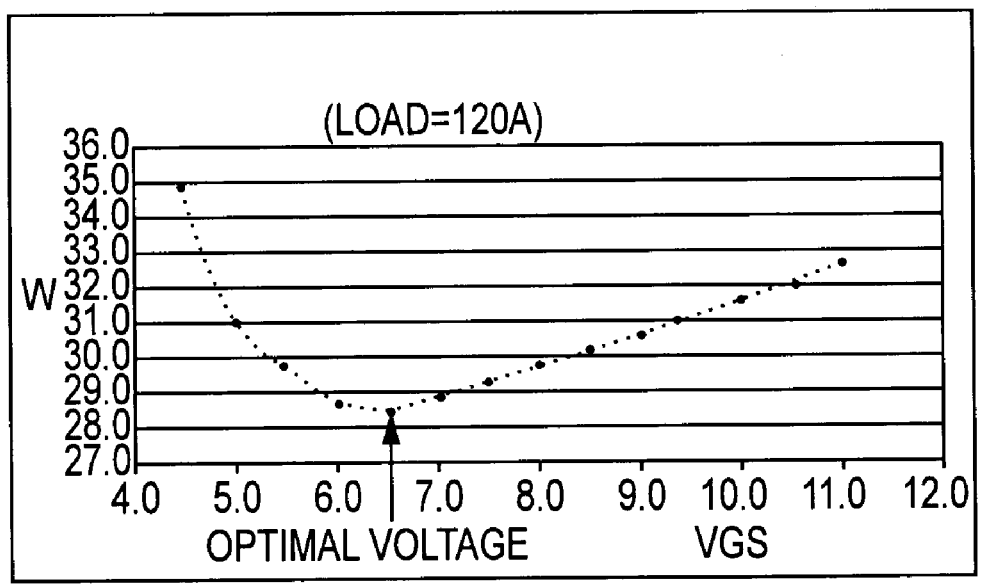
FIG. 2 is a graph showing total power loss vs. gate drive voltage in typical DC/DC converters.
Figure 3:
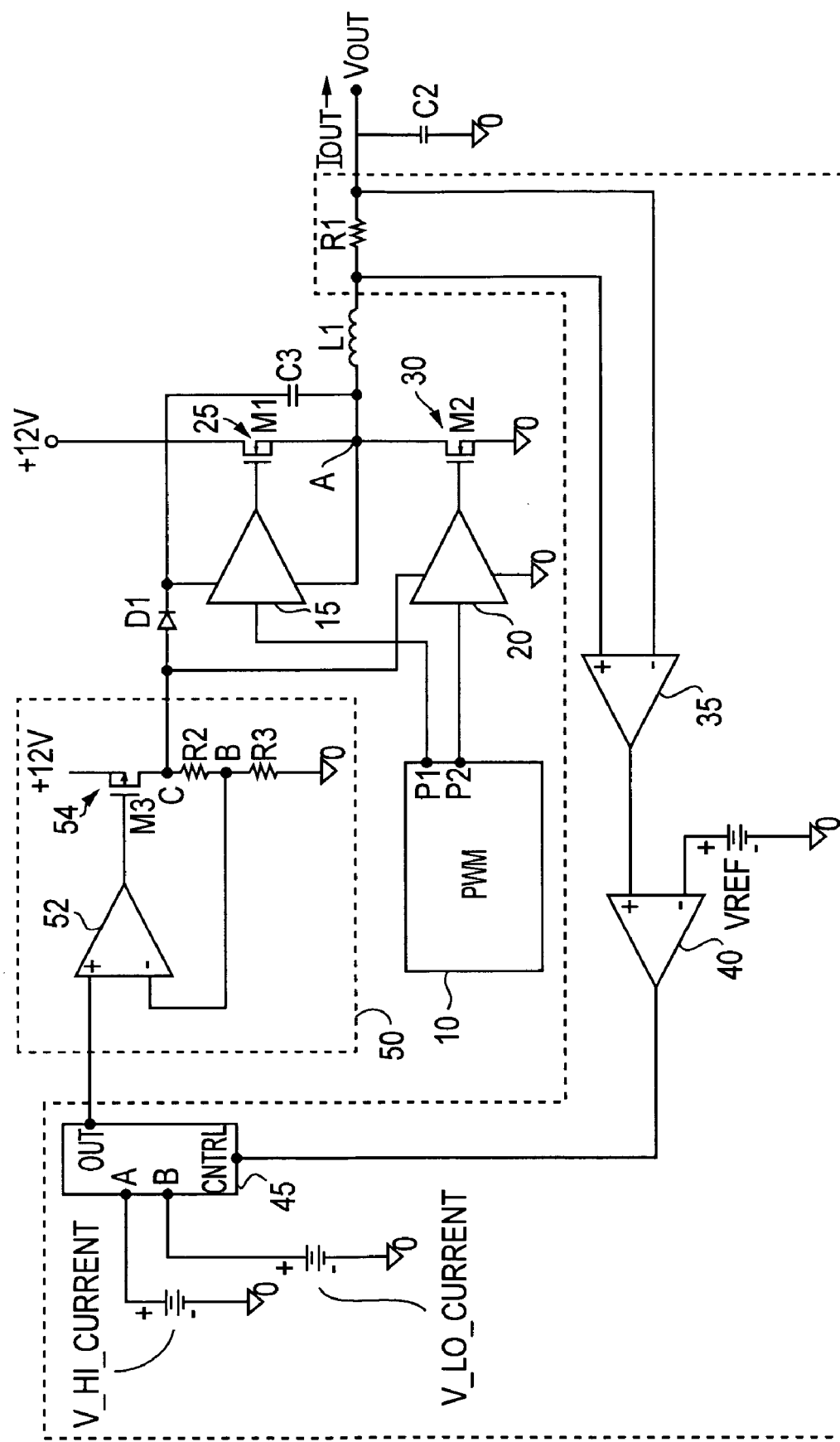
FIG. 3 is a schematic diagram of a DC/DC converter according to an embodiment of the invention.

A DC/DC converter having an adaptive gate drive voltage circuit 100 is shown in FIG. 3. The converter comprises a PWM controller 10 with outputs P1, P2 for controlling the high side gate driver 15 and the low side gate driver 20. The driver 15 drives an N-channel power MOSFET M1 (25) and the driver 20 drives a N-channel power MOSFET M2 (30). The MOSFETs M1 and M2 are connected in a totem-pole arrangement, delivering the output of the converter at a node A therebetween. Also shown are a bootstrap diode D1, a bootstrap capacitor C3, a filtering inductor L1, and a filtering capacitor C2.

The foregoing components and their operation are conventional and will be well known to those conversant with this art.

The output current from the node A is sensed in this example by a sense resistor R1 in series with the output inductor. The voltage developed across this resistor is sensed by an amplifier 35. The output of this amplifier is a voltage proportional to the output current.

Those having skill in this art will know of other current sensing and feedback techniques, besides those just described, that may be used with the present invention.

In the example of FIG. 3, the output of the current sense amplifier 35 is compared with a reference voltage $V_{REF}$ by a comparator 40. The reference voltage $V_{REF}$ sets a threshold between a "heavy-load" and a "light-load" condition. If the output current is a "heavy load", the output of the comparator is high. The comparator gives a low output if the output current is a "light load".

The output of the voltage comparator 40 is sent to the control pin CNTRL of the 2:1 multiplexer 45, which determines which of two reference voltages is sent to the linear regulator 50. Refer to the table below:

| COMPARATOR OUTPUT (CNTRL PIN) | MUX OUTPUT (OUT PIN) |
| --- | --- |
| HIGH | V_HI_CURRENT |
| LOW | V_LO_CURRENT |

The linear regulator 50 comprises an amplifier 52 which drives a p-channel MOSFET M3 (54) to control the current from a 12 VDC supply through a voltage divider R2, R3. The amplifier receives at its non-inverting input the selected reference voltage V_HI_CURRENT or V_LO_CURRENT from the multiplexer 45. It receives at its inverting input a feedback signal from a node "B" between R2 and R3. A voltage at a node "C" between M3 and R2 is the selected drive voltage to be supplied to the drivers 15, 20 for driving the MOSFETs M1, M2, respectively.

The linear regulator thus provides a gate voltage that is a function of the output current. Typically, the gate voltage is in the range of (6.5V-8V) for high output currents and it is 4V-5V for "light-load" currents. These voltages give optimal gate drive efficiency for both load conditions.

There are many ways to sense output current and there are many methods for adjusting a reference or feedback voltage. Although there are two reference voltages in this example, three or more could be used. For example, multiple comparators could be used for sensing multiple current set points. See FIG. 4, in which the feedback voltage from amplifier 35 is compared against three thresholds $V_{REF}$, $V_{REF2}$ and $V_{REF3}$ by comparators 40, 41 and 42, whose outputs will indicate whether the feedback voltage is above, below or between the three threshold voltages. The outputs from comparators 40, 41 and 42 are provided to inputs of a multiplexer 46 which is thereby controlled to select one of four control voltages V-ITHRESH1 through V-ITHRESH4, which are representative of the four voltage ranges above, below and between the thresholds $V_{REF}$, $V_{REF2}$ and $V_{REF3}$. The selected control voltage is then supplied to the amplifier 52 of the linear regulator 50.

Figure 4:
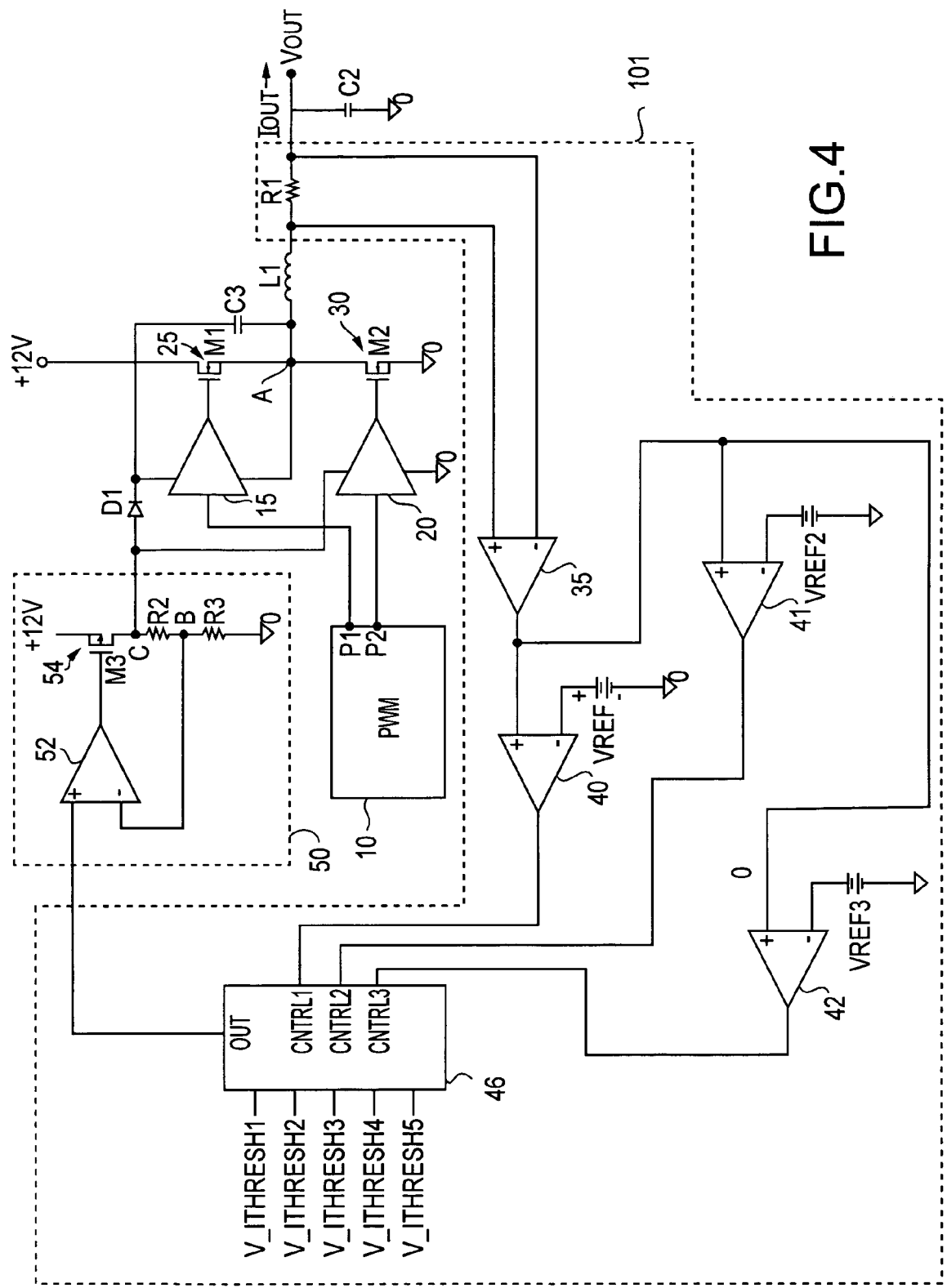
FIG. 4 is a schematic diagram of a DC/DC converter according to a second embodiment of the invention.
Figure 5:
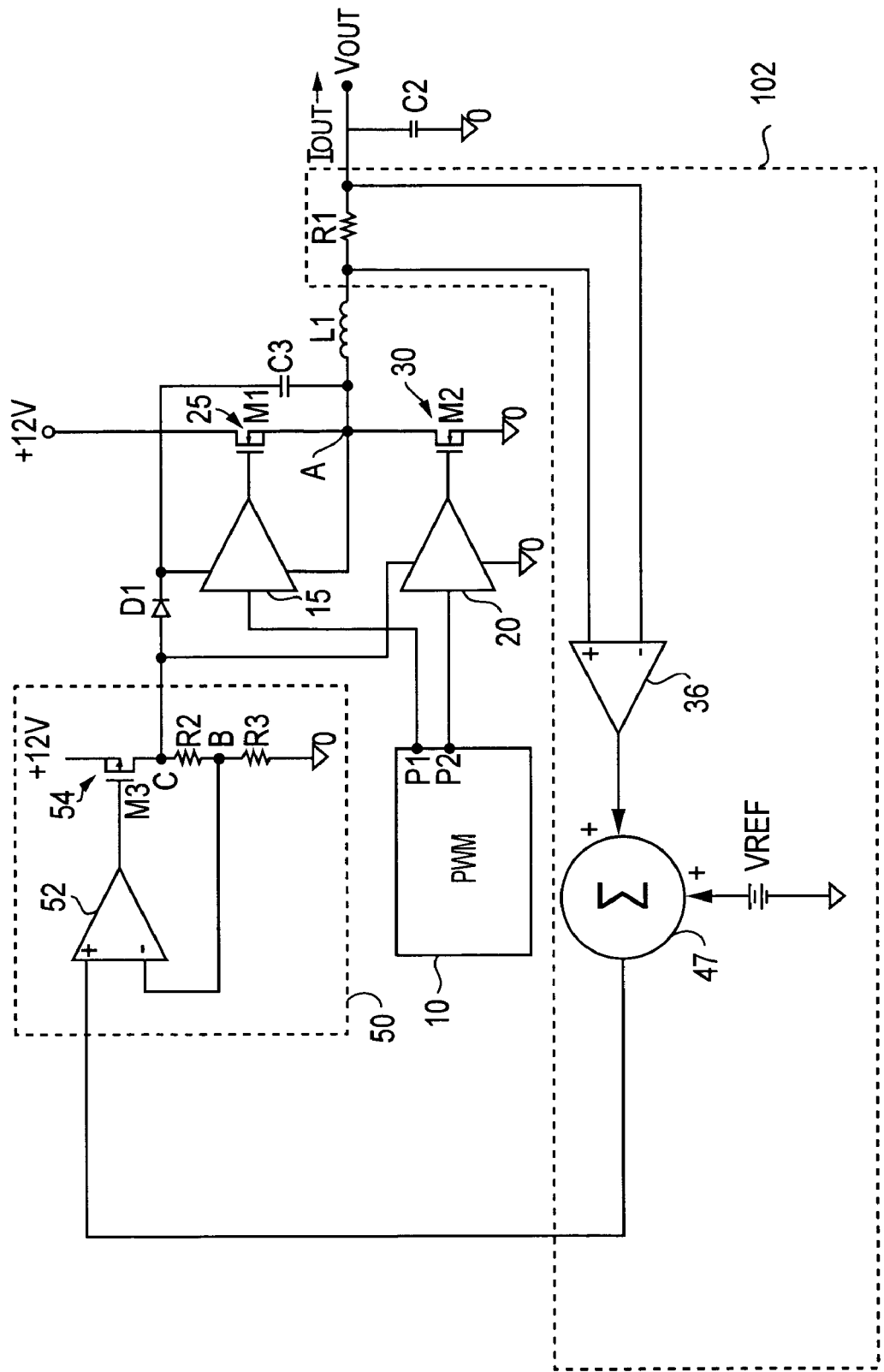
FIG. 5 is a schematic diagram of a DC/DC converter according to a third embodiment of the invention.

In another alternative, a linear amplifier 36 having gain-setting components giving the amplifier a predetermined gain characteristic is used to track the output current, rather than the comparators and mulitplexer in FIGS. 3 and 4. In the embodiment of FIG. 5, the feedback voltage from the amplifier 36 is added to a reference voltage $V_{REF}$ by a summer 47, and the summed output is then applied directly to the amplifier 52. By these means, the gate drive voltage is reduced in response to a reduction in $I_{OUT}$, to reduce gate drive and switching losses, or increased when $I_{OUT}$ increases, so as to reduce conduction losses, to reach an optimum drive voltage.

Thus, although the present invention has been described in relation to particular embodiments thereof, many other variations and modifications and other uses will become apparent to those skilled in the art. Therefore, the present invention is not limited by the specific disclosure herein.

What is claimed is:

1. A DC/DC converter comprising:
   at least one switching device responsive to a drive signal having a drive voltage level, for receiving power at a DC input and delivering DC output current to an output circuit of said converter;
   a driver for supplying said drive signal to said switching device;
   an adaptive drive voltage circuit which generates a feedback signal responsive to said DC output current, and in response thereto generates a control signal; and
   a linear regulator which receives said control signal at an input thereof, and controls said driver to supply said drive voltage level to said switching device;
   wherein said linear regulator comprises:
   an amplifier which receives said control signal at a first input thereof;
   a drive voltage source comprising a resistance which generates said drive voltage level according to a current through said resistance, and a transistor in series with said resistance for controlling said current;
   an output of said amplifier being connected to a control terminal of said transistor; and
   a voltage from said drive voltage source being fed back to a second input of said amplifier.

2. The DC/DC converter of claim 1, wherein said adaptive drive voltage circuit, in response to a reduction of output current, reduces said drive voltage level so as to reduce losses in said switching device.

3. The DC/DC converter of claim 2, wherein said adaptive drive voltage circuit defines at least one current threshold, and selects one of at least two predetermined drive voltage levels, in response to whether said output current is above or below said threshold.

4. The DC/DC converter of claim 2, wherein said adaptive drive voltage circuit defines a first plurality of current thresholds, and selects one of a second plurality of predetermined drive voltage levels in response to whether said output current is above, below or between said first plurality of current thresholds.

5. A DC/DC converter comprising:
   a pair of semiconductor switching devices for receiving power at a DC input and delivering DC output current to an output circuit of said converter connected to said pair of semiconductor switching devices;
   a pair of drivers, each for supplying a respective gate drive signal to a corresponding gate of one of said switching devices, said gate drive signals having a gate drive voltage level;
   an adaptive drive voltage circuit which generates a feedback signal responsive to said DC output current, and in response thereto generates a control signal; and
   a linear regulator which receives said control signal at an input thereof, and controls said drivers to supply said drive voltage level to said switching devices;
   wherein said linear regulator comprises:
   an amplifier which receives said control signal at a first input thereof;

a drive voltage source comprising a resistance which generates said drive voltage level according to a current through said resistance, and a transistor in series with said resistance for controlling said current;

an output of said amplifier being connected to a control terminal of said transistor; and a voltage from said drive voltage source being fed back to a second input of said amplifier.

6. The converter of claim 5, wherein said pair of semiconductor switching devices are connected in a totem-pole arrangement and said output circuit is connected to a junction point between said pair of semiconductor switching devices.

7. The converter of claim 5, comprising setting circuitry which responds to a reduction of said output current by reducing said gate drive voltage level, thereby reducing losses in said switching devices.

8. The converter of claim 7, wherein said reduction of said gate drive voltage level results in a reduction of switching losses and gate drive losses.

9. The converter of claim 7, wherein said setting circuitry defines at least one current threshold, and selects one of at least two predetermined gate drive voltage levels, in response to whether said output current is above or below said threshold.

10. The converter of claim 7, wherein said setting circuitry defines a first plurality of current thresholds, and selects one of a second plurality of predetermined drive voltage levels in response to whether said output current is above, below or between said first plurality of current thresholds.

11. The converter of claim 7, wherein said setting circuitry selects one of at least two reference voltages corresponding to said gate drive voltage level.

12. The converter of claim 11, wherein said setting circuitry comprises a multiplexer responsive to said output current and connected to said at least two reference voltages, and delivers one of said at least two reference voltages for controlling said gate drive voltage level.

13. The converter of claim 7, wherein said setting circuitry increases said gate drive voltage level in response to an increase in said output current, thereby reducing conduction losses in said switching devices.

14. The DC/DC converter of claim 1, wherein said adaptive drive voltage current comprises a summer which receives said feedback signal and a reference voltage and generates said control signal.

15. The DC/DC converter of claim 14, wherein said feedback signal is generated by an amplifier having a gain characteristic and supplied thereby to said summer.

16. The converter of claim 5, wherein said adaptive drive voltage current comprises a summer which receives said feedback signal and a reference voltage and generates said control signal.

17. The converter of claim 16, wherein said feedback signal is generated by an amplifier having a gain characteristic and supplied thereby to said summer.

18. The DC/DC converter of claim 1, wherein said resistance comprises a pair of resistors connected in series with said transistor, and said fed-back voltage is obtained at a junction point between said pair of resistors.

19. The DC/DC converter of claim 18, wherein said drive voltage source comprises a series circuit of said transistor and said two resistors connected between said DC input and a common point of said DC/DC converter.

20. The DC/DC converter of claim 5, wherein said resistance comprises a pair of resistors connected in series with said transistor, and said fed-back voltage is obtained at a junction point between said pair of resistors.

21. The DC/DC converter of claim 20, wherein said drive voltage source comprises a series circuit of said transistor and said two resistors connected between said DC input and a common point of said DC/DC converter.

* * * * *